(12) United States Patent
Leung et al.

(10) Patent No.: US 6,507,941 B1
(45) Date of Patent: Jan. 14, 2003

(54) SUBGRID DETAILED ROUTING

(75) Inventors: Hardy Kwok-Shing Leung, San Jose, CA (US); Raymond X. Nijssen, San Jose, CA (US)

(73) Assignee: Magma Design Automation, Inc., Cupertino, CA (US)

( * ) Notice: Subject to any disclaimer, the term of this patent is extended or adjusted under 35 U.S.C. 154(b) by 0 days.

(21) Appl. No.: 09/301,143

(22) Filed: Apr. 28, 1999

(51) Int. Cl.$^7$ ................................................ G06F 17/50
(52) U.S. Cl. ................................................ 716/14; 716/13
(58) Field of Search ..................... 716/1, 2, 12, 13, 716/14

(56) References Cited

U.S. PATENT DOCUMENTS

| | | | | |
|---|---|---|---|---|
| 4,615,011 A | * | 9/1986 | Linsker | 364/491 |
| 4,855,929 A | | 8/1989 | Nakajima | |
| 5,583,788 A | | 12/1996 | Kuribayashi | |
| 5,636,129 A | | 6/1997 | Her | |
| 5,657,242 A | * | 8/1997 | Sekiyama et al. | 364/491 |
| 5,677,847 A | * | 10/1997 | Walling | 364/488 |
| 5,793,643 A | | 8/1998 | Cai | |

FOREIGN PATENT DOCUMENTS

WO          WO 98/41938           9/1998

* cited by examiner

*Primary Examiner*—Matthew Smith
*Assistant Examiner*—Leigh Marie Garbowski
(74) *Attorney, Agent, or Firm*—Pillsbury Winthrop LLP

(57) ABSTRACT

Disclosed is a subgrid detailed router that performs searches for wire locations at the grid level. Once a solution is found, the wire is placed in a based upon a finer subgrid. Specifically, the present invention includes subgrids that in a preferred embodiment have a resolution that is 16X greater than the resolution of the conventional grids. This increased resolution is useful for improving routing density with variable width and variable spacing designs. In operation, the subgrid detailed router of the present invention searches at the grid level for potential wire paths using a code associated with each grid. This code contains data corresponding to each of the subgrids, such that upon completion of a routing a net, information exists that allows for the placement of the net at locations corresponding to the subgrid that has finer resolution than the grid which was used to implement the routing search. Thus, the present invention is as efficient as conventional grid based routers in finding an appropriate path.

45 Claims, 18 Drawing Sheets

SUBGRID DETAILED ROUTING

FIELD OF THE ART

The present invention relates to a router for use in fabricating integrated circuit chips, and, more specifically, a subgrid detailed router

BACKGROUND OF THE RELATED ART

In the art of integrated chip layout, routing is the term used describe placing wires into locations on an integrated circuit chip. There are two conventional approaches to detailed routing, which are grid based routing systems, and gridless routing systems.

Prior to discussing detailed routing, it is helpful to put in context the overall design steps that are conventionally implemented when fabricating the physical design of an integrated circuit chip using a physical design system. As illustrated in FIG. 1, the overall design flow of the physical design includes receiving a cell level netlist, as shown in step 2. Thereafter, this cell level netlist is used to determine the placement of modules that exist within the netlist into locations on the chip, shown as step 4. Modules will contain information relating to a combination of logical functions, and will include the pin and obstacle information needed for routing purposes. The netlist will also contain information relating to the various different pins that need to be interconnected. Thereafter, in a global routing step 6, a global routing grid (which may have been implemented in the placement step), is used to route various wires between pins of modules that traverse paths over several global routing grids. In a following detailed routing step 8, a detailed routing grid (or simply routing grid hereafter) is implemented, typically at a higher resolution than the previously discussed global routing grid, and the detailed placement of wires is performed. The output of the detailed routing step 8 is an integrated circuit fabrication mask.

In a conventional grid based detailed routing system, each of the different layers of an integrated circuit chip is represented in the detailed routing grid. The detailed routing grid is a 3D representation, with each of the different layers of the integrated circuit needed for routing purposes having a uniform area that is subdivided into the routing grids previously discussed, thereby forming a grid pattern for each layer. FIG. 2A illustrates one layer of such a 3D routing grid, in which that layer is subdivided into a grid pattern 10 having separate grids 12 of uniform size. This uniform size of the grids 12 is typically determined by the minimum width of the wires that can be obtained plus the minimum spacing that must be maintained between adjacent wires and/or vias.

The 3D routing grid will have layers corresponding to the different routing layers. As shown in FIG. 2B, a typical integrated circuit will have at least a semiconductor layer, and three wiring layers, such as HVH wiring layers, which stands for horizontal, vertical and horizontal wiring. In HVH wiring, one wiring layer (H1) is generally used to make horizontal traversals, another wiring layer (V) is generally used to make vertical traversals, and another layer (H2) is generally used to make horizontal traversals. Using these different wiring layers, and vias that interconnect adjacent layers together, pins of modules that need to be interconnected can be connected together using the 3D routing grid.

When performing detailed routing, the detailed router receives chip technology description data and data that has been generated as a result of the global routing step, which describe data including the number of layers (levels) on which rectangles representing wires can be generated, the minimum allowed width of any part of the path of rectangles, and the minimum allowed separation between any non-electrically-connected rectangles, as is conventionally known.

In detailed routing, data associated with the various modules is received. For detailed routing purposes, the detailed router interprets this information either as a pin or an obstacle. For any set of pins being interconnected, those pins are not obstacles, but other pins, and other wires that have been previously generated, as well as other obstacles, must be avoided in order to avoid a short circuit. Each of these pins and obstacles is represented as a set of rectangular shapes and will have an associated position and associated layer that is maintained in the database.

Various conventions are used for the representation of pins, wires (or nets) and obstacles in a grid. A common convention—called the centerline convention—is that the grid describes the acceptable location for the centerline of the paths that is used during the expansion process to determine the path of a net. When a net is routed, the path must stay away from existing obstacles, such as other wires, vias, and pins of other nets that have been previously placed in the 3D routing grid. In order to stay away from these obstacles, they are modeled by marking certain grid points as invalid. Thus, every intersection of the horizontal and vertical equidistant gridlines is tracked as a position to which the center of a square of a net to be routed may be assigned when legal. Such an assignment is legal if the square centered on the grid point has legal separation with respect to all other rectangles not associated with the net currently being routed. It may require traversals over several proposed paths before a successful traversal results in a placement location being found FIG. 3. illustrates a representation of a portion of a routing grid and the obstacles and pins associated therewith. As can be seen, associated with one module are pins 12A and 12*b*, and obstacles 14A and 14B. Associated with another module are Pins 12C and 12D; and obstacles 14C and 14D. Furthermore, the region marked 14E shows the interconnection of the pins 12B and 12C. Thus, for interconnections of other nets, the region marked 14E will also be an obstacle.

Using a list of the different pins that need to be connected, the detailed router will traverse a path from the initial pin location (such as pin 12B in FIG. 3, to an endpoint pin location (such as pin 12C In reply to FIG. 3). It should be noted that in many cases, there exist many different possible connection locations to which the endpoint pin location can legally go, and once the detailed router finds a first such endpoint pin location, it has completed its task for that net, and will then move onto routing the next net. It should be noted that provision is also made for routing vias that connect conductors that exist at different adjacent levels and are used to form a single wire.

With that background description of grid based routing in mind, it will be appreciated that detailed routing grids are represented as a set of grid points and a set of edges between adjacent grid points. A so-called cost value is associated with every edge. Thus, detailed routing is a combinatorial optimization with the objective being to find a path of vertices between not yet connected features that are part of the net, including its pins. One manner in which to find the path between two points in a grid (such as two pins of different modules that need to be connected) can be found using a shortest path algorithm such as Dijkstra's shortest path algorithm. Routers that operate in the above-described manner are known as Lee-type routers.

In a detailed router, obstacle and wire congestion modeling analyses are also used in grid based routing systems to increase the likelihood that the particular wire placement determined during the global routing stage can actually be implemented at a finer level (i.e., within a portion of the grid in which it was placed). However, regardless of the effort put into these modeling techniques, they are either too optimistic at the expense of routing completion or too pessimistic at the expense of density. Thus, as integrated circuits become more complex and deep submicron designs proliferate, conventional grid based routing systems are not able to implement all of the design requirements. For example, in deep submicron designs, it is desirable to have wires having different and non-uniform widths and spacings. While a grid based routing system will permit different and non-uniform wire widths and spacings in certain circumstances, the constraints that occur as a result make it undesirable to implement different and non-uniform wire widths and spacings in such systems.

From the above description, it will also be apparent that the choice of the routing grid is extremely important, as it affects the packing efficiency, which measures how tightly the wires can be packed, with the constraint that the centerlines of the wires are on the chosen grid, compared with the packing in a gridless world. Suppose the width and spacing are both 0.4 $\mu$m (0.4 microns) on all layers, as illustrated in FIGS. 4A and 4B. Then a natural routing grid has track separations of 0.8 $\mu$m (both horizontally and vertically) as illustrated in FIG. 4C, and adjacent wires can be packed at 100% packing efficiency. However, if the routing grid is chosen to be 0.6 $\mu$m or 1.2 $\mu$m, as illustrated in FIGS. 4D and 4E, then the wires can only be packed at 66% packing efficiency. If the routing grid is chosen to be 0.4 $\mu$m, the wires can be maximally packed at 100%, but the size of the grid is quadrupled (doubled in each direction).

Accordingly, when width and spacing on different layers and different wires exists, the choice of the routing grid becomes even more difficult, as it will have a direct impact on the packing efficiency. In practice, existing grid-based routers require the routing grid, as well as the width and spacing of all nets to be chosen a priori, and are not subjected to change. When there are a variety of net-dependent width and spacing requirement, often time the worst-case values are chosen. The loss in packing efficiency due to improper matching between the routing grid and the width and spacing is called fragmentation. The process of determining the correct width (per layer), spacing (per layer), and routing grid to be used throughout routing is called pitch matching. Poor pitch matching results in significant degradation in quality and runtime of grid-based maze routing algorithms.

Also, one of the significant constraints on grid based routing systems, particularly for more complex designs, is the time that it takes to perform routing. When designs were simpler, the size of the grid—the separation between adjacent grid points—could be made relatively large, and, therefore, the time that it took to determine traversal paths was relatively short. Thus, for less complex semiconductor designs, grid based routing systems have been adequate and routing completion was obtained within acceptable time periods.

As designs have become more complex, however, it is not a simple matter to just reduce the size of the grid, since reducing the size of the grid brings with it a significant increase in the number of grid points, and hence a significant increase in the time needed to traverse a path. For instance, by taking a grid that was previously a single grid square per unit area and making that same grid square a quadruple in both the horizontal and vertical dimensions, thereby resulting in a grid having the resolution illustrated in FIG. 5. As compared to FIG. 2A, this results in a 16X increase in the number of grid points, and hence a significant increase in the runtime of the maze router used to determine a path. Such an increase in time is not a practical solution, since designers are unwilling to wait such long periods in order for the routing to occur.

The other approach that has been used for routing is known as a gridless routing system. As it is implied by the name gridless, such routing does not use a grid for routing, but instead keeps track of all of the obstacles based upon their location with respect to each other. Such a gridless routing system theoretically has as an advantage in that it can find a path that does not have to adhere to a predefined routing grid, as in the case of a grid-based router. While this theoretical advantage exists, such systems are technically complex and complicated, do not typically perform as well as expected, and are typically slow, especially as the integrated circuit that is being routed becomes more and more complex.

As a result of the complexity of gridless routing systems, attempting to modify them to perform even more sophisticated design requirements is not practicable.

Accordingly, a routing system that can correctly route a path in a reasonable period of time is still needed.

SUMMARY OF THE INVENTION

It is an object of the present invention to implement a router that can efficiently route wires that have variable widths and spacings.

It is an object of the present invention to implement a router that has the efficiency of a conventional maze router for path expansion;

It is an object of the present invention to implement a router that has greater resolution than conventional grid based routers while not requiring an increase in runtime as compared to conventional grid based routers.

It is a further object of the invention to implement a router that guarantees a path exists at a finer subgrid level once a traversal path determined at the grid level is found.

It is still a further object of the present invention to provide for an increased probability that there exists an adequate pitch match between adjacent layers.

It is yet another object of the present invention to be able to more efficiently operate upon obstacles that have edges that do not fall on grid level boundaries.

The present invention attains the above-recited objects of the present invention, among others, by implementing a detailed subgrid router that performs searches for wire locations at the grid level. Once a solution is found, the wire representation is made based upon a finer subgrid. Due to the manner in which the search is performed at the grid level, the present invention guarantees that a path for that wire will exist at the finer subgrid level. The rectangles representing the wire is then stored in the database that includes the other corresponding information, so that it can be treated as an obstacle when routing a subsequent wire. Specifically, the present invention includes subgrids that in a preferred embodiment have a resolution that is 16X greater than the resolution of the conventional grids. This increased resolution is useful for improving routing density with variable width and variable spacing designs.

In operation, the subgrid detailed router of the present invention searches at the grid level for potential wire paths using a code associated with each grid. This code contains data corresponding to each of the subgrids, such that upon completion of a routing a net, information exists that allows for the placement of the net at locations corresponding to the subgrid that has finer resolution than the grid which was used to implement the routing search. Thus, the present invention is as efficient as conventional grid based routers in finding an appropriate path.

BRIEF DESCRIPTION OF THE DRAWINGS

The above and other objects, features, and advantages of the present invention are further described in the detailed description which follows, with reference to the drawings by way of non-limiting exemplary embodiments of the present invention, wherein like reference numerals represent similar parts of the present invention throughout several views and wherein:

FIGS. 14A–14F illustrate the an aspect of the data representation process according to the subgrid detailed routing according to the present invention;

DETAILED DESCRIPTION OF THE PREFERRED EMBODIMENTS

Figure 1:
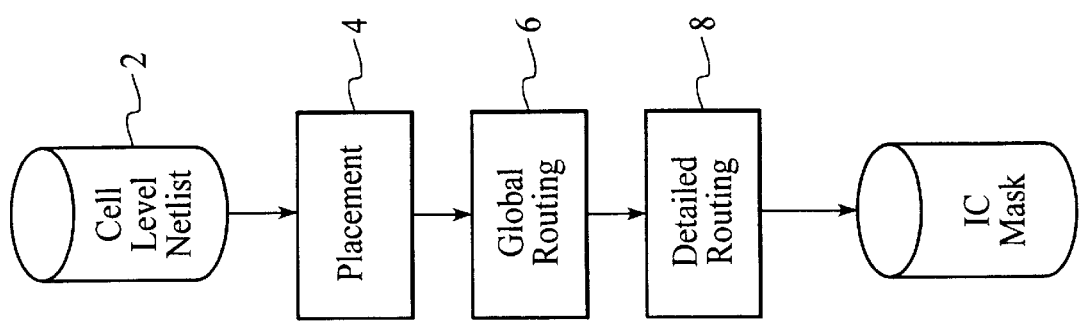
FIG. 1 illustrates an overview of a conventional place and route process used in the physical design for the fabrication of integrated circuit chips.
Figure 2A:
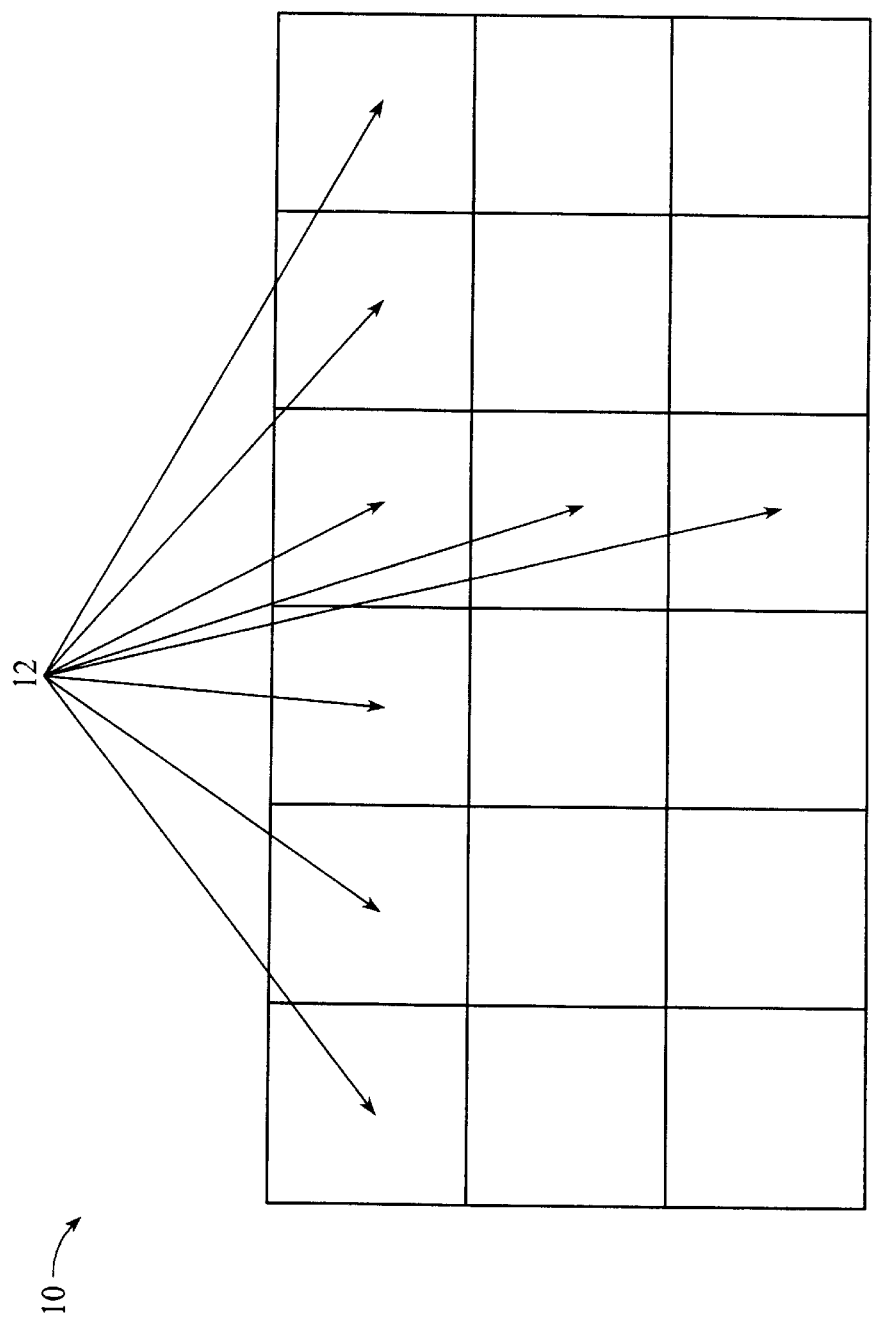
FIG. 2A illustrates a conventional grid used in on layer of a conventional 3D grid-based routing system.
Figure 2B:
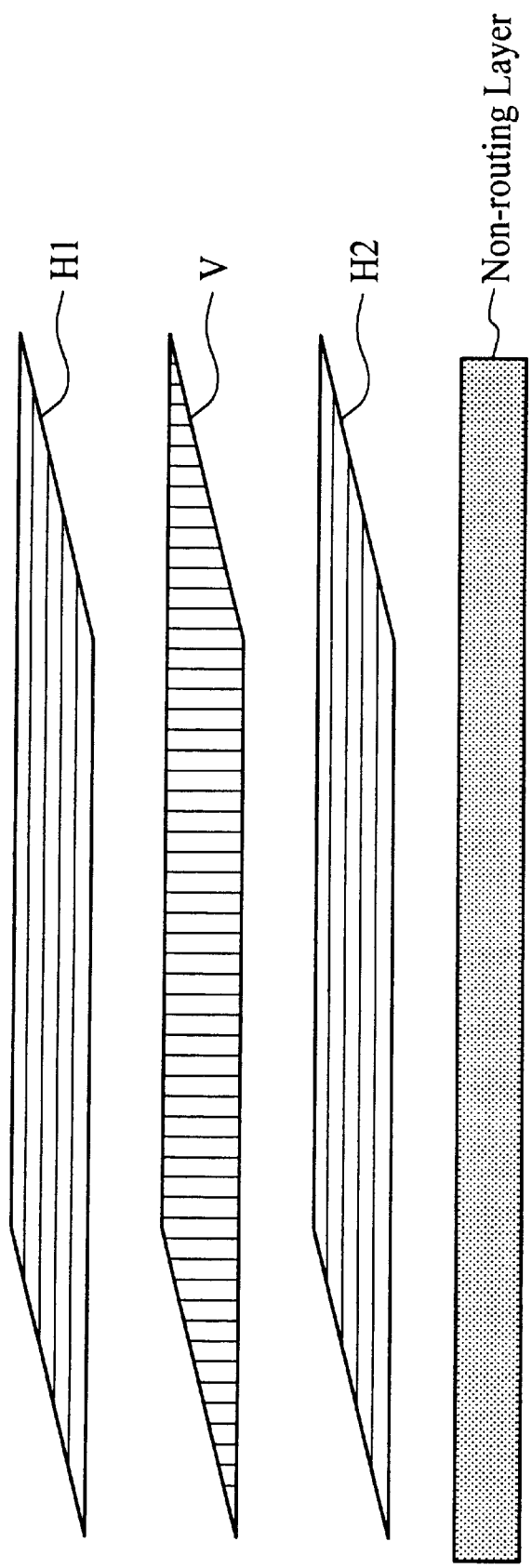
FIG. 2B illustrates representations different physical layers corresponding to the layers of a conventional 3D grid-based routing system.
Figure 3:
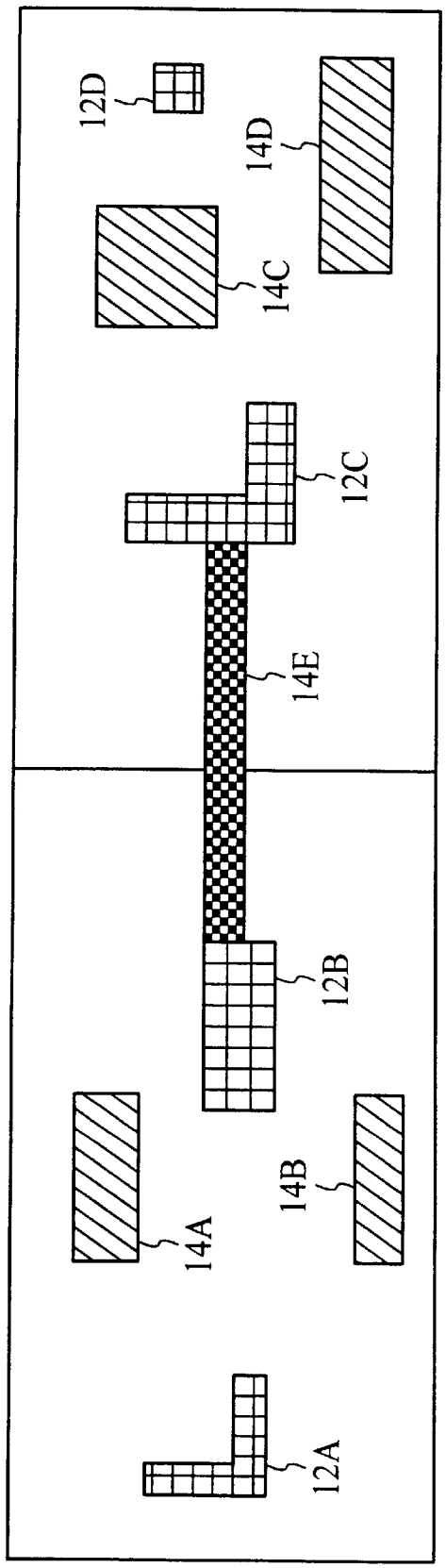
FIG. 3 illustrates a top view of the representation of the pins, obstacles and wires used in a conventional routing system.
Figure 4C:
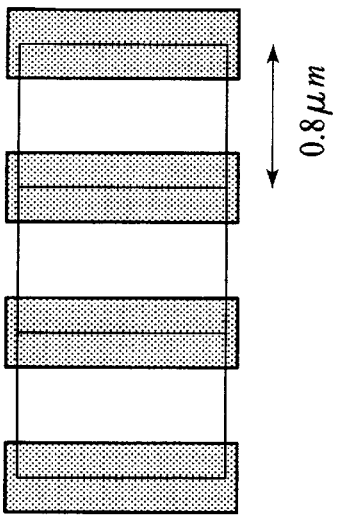
FIGS. 4A–4E illustrate the property of grid selection, packing efficiency and fragmentation.
Figure 4E:
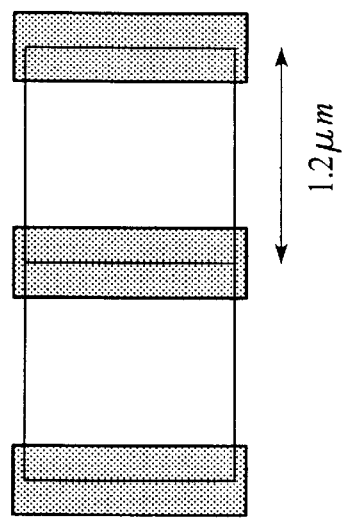
Figure 4B:
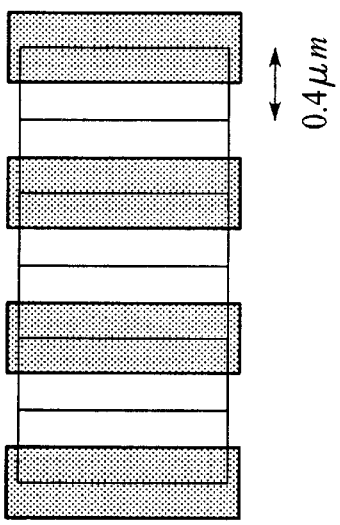
Figure 4D:
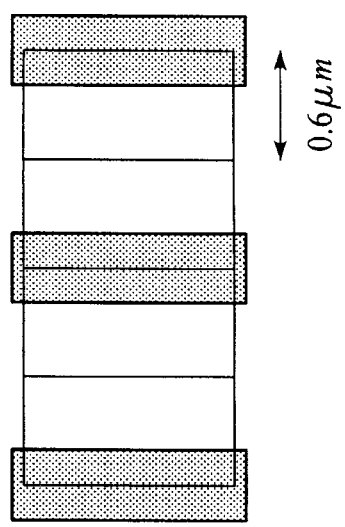
Figure 4A:
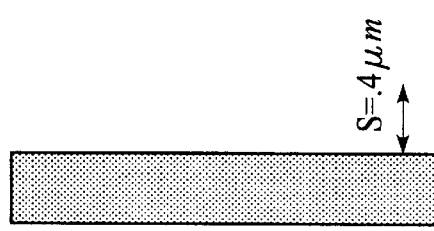
Figure 5:
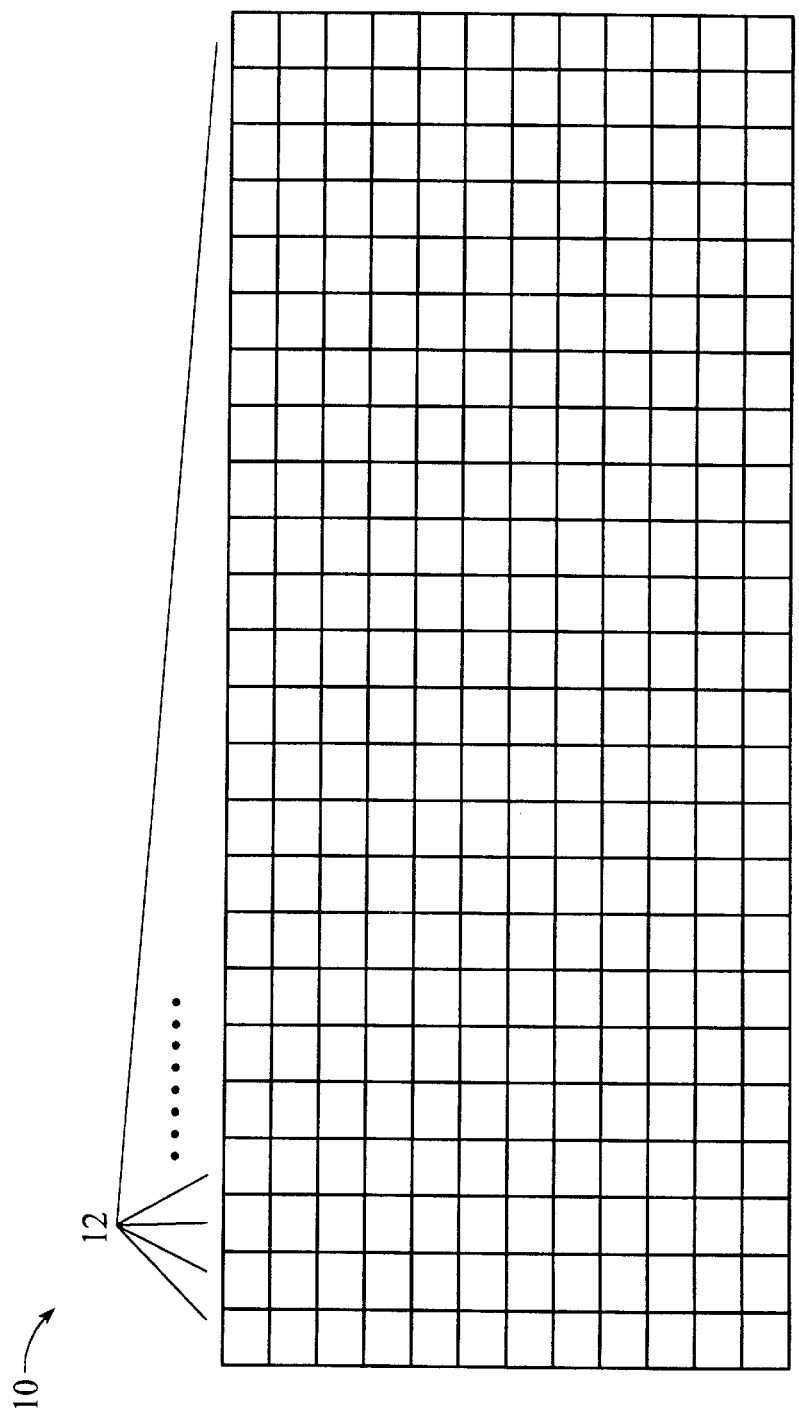
FIG. 5 illustrates a conventional grid used in a conventional grid-based routing system that has 16 times the resolution of the grid illustrated in FIG. 1'
Figure 6:
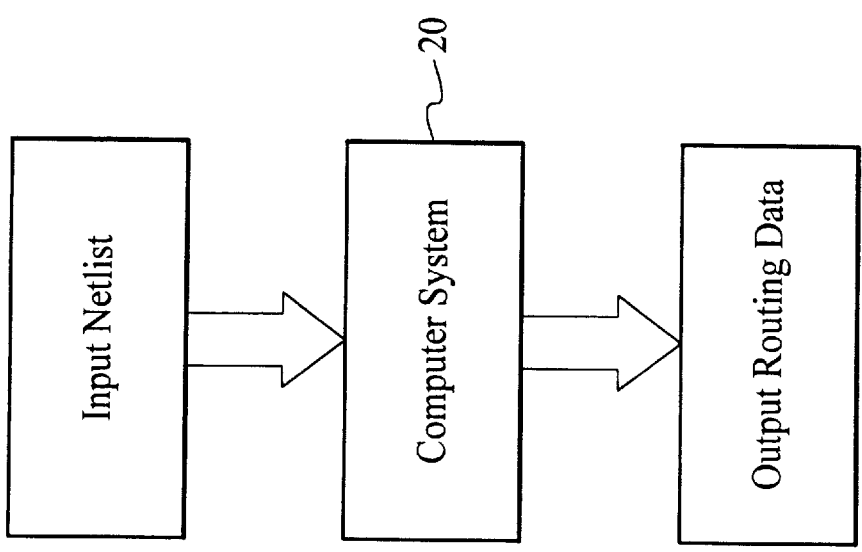
FIG. 6 illustrates a block diagram of the subgrid-detailed router according to the present invention.

The present invention implements a routing approach that handles variable widths and spacing in a simple, intuitive manner. As shown in FIG. 6, the present invention is implemented in a computer system, such as an Intel processor based computer system running on a Unix operating system platform. The present invention is implemented as a sequence of coded program instructions, preferably written in an object oriented programming language such as C++. In operation, the present invention is run as a router application program, described in detail hereinafter, that accepts data corresponding to the desired characteristics of the integrated circuit chip, typically known as a netlist that represents the nets, modules, and pins as described previously, and operates upon this data to determine the placement of wires in an integrated circuit chip representation, thereby resulting in routing data that is output from the router.

Figure 7:
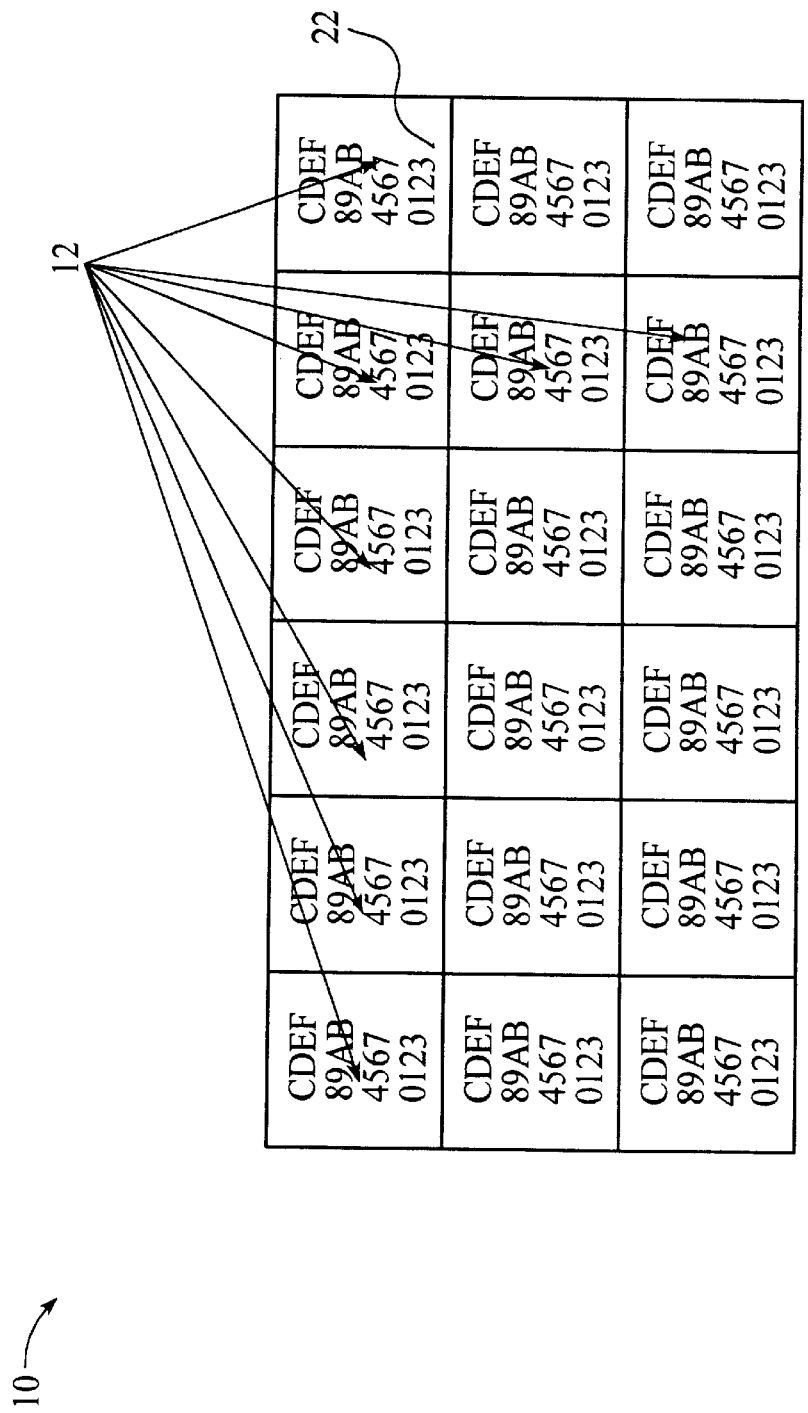
FIGS. 7 and 8 each illustrate different aspects of subgrids according to the present invention.

As shown in the concept diagram of FIG. 7, the router 20 according to the present invention is grid based, and for a bounded area 10 has grids 12 that have similarities to that of conventional grid based routing system. While the placement of modules be performed along with as in a conventional grid-based routing system, placement of modules can also be performed using a timing driven approach such as described in U.S. patent application Ser. No. 09/054,379 entitled Timing Closure Methodology filed on Apr. 2, 1998 in the U.S. Patent and Trademark Office, the contents of which are expressly incorporated by reference herein. Further, the routing of wires can also be incorporated with the routing system described in U.S. patent application Ser. No. 09/054,319 entitled Method of Designing a Constraint Driven Integrated Circuit Layout filed on Apr. 2, 1998 in the U.S. Patent and Trademark Office, the contents of which are expressly incorporated by reference herein.

Unlike a conventional grid-based routing system, however, the present invention includes the concept of sub-grids, illustrated as fine grids or sub-grids 22. Within each grid there are a plurality of subgrids, illustrated in FIG. 7 as subgrids 22 in positions 0, 1, 2, 3, 4, 5, 6, 7, 8, 9, A, B, C, D, E, and F.

Figure 8:
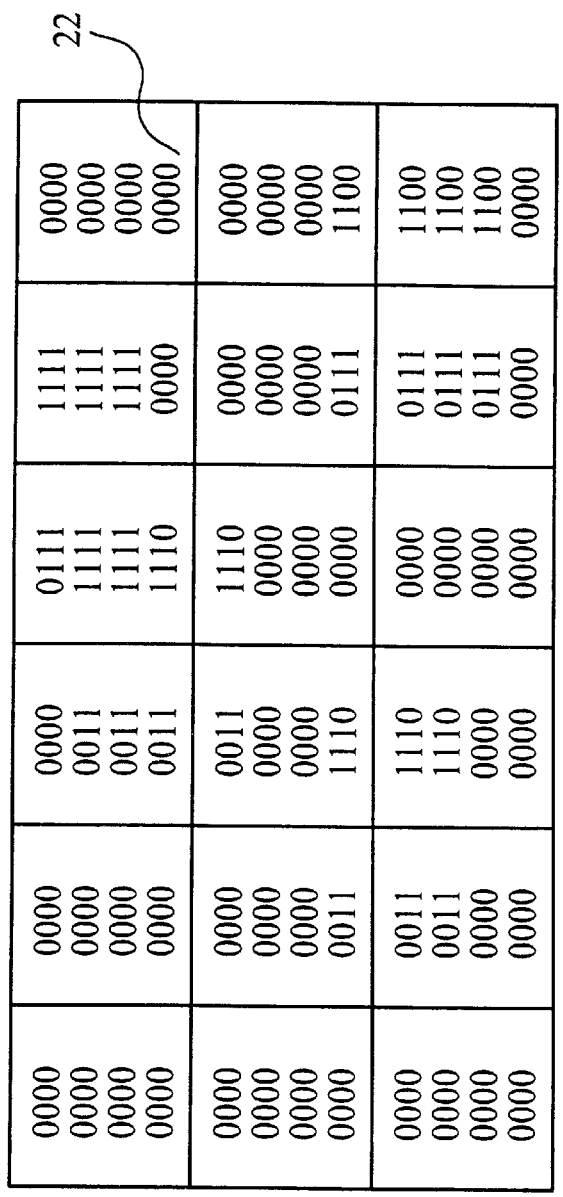

FIG. 8 illustrates the subgrids 22 with the indicia that is associated with each subgrid and used to determine available locations in which to route a wire as will be explained in further detail hereinafter. As illustrated, a particular subgrid will have attributed to it an availability indicia in the preferred embodiment as a binary "1", and a non-availability indicia in the preferred embodiment as a binary "0". According to the present invention, this indicia is used to store representations of locations that are available or not for a wire to be placed. Indicia corresponding to the locations that a new wire is routed on will then change from a "1" to a "0" after that new wire is routed.

The present invention associates groups of these indicia together, such that there exists one code for each different grid. Accordingly, by using this code, the present invention is able to have the path finding algorithm, such as the Lee-type algorithm or BFS algorithm, use the grid as the search space when expanding from one grid to another in an attempt to find a legal set of locations that can be used to create a path, but is then able to place the wire, using the determined path, in a solution space that has locations based upon the subgrid.

The specifics of how the subgrids are used to implement the subgrid router according to the present invention will be described in further detail hereinafter. Initially, however, an example of the concept of the subgrid detailed router according to the present invention, and the advantages that result therefrom, will be introduced.

As mentioned previously with respect to FIGS. 4A–4E, using finer routing grids helps improve routing density. Finer routing grids have not been practical using conventional grid-based router, however, since the increase in runtime is a great disincentive to using finer grids.

According to the present invention, however, the subgrid detailed router performs searches for wire locations at the grid level, but once a solution is found, the wires are placed in locations on a subgrid level. An overview comparison with conventional routing will illustrate this point.

Figure 9C:
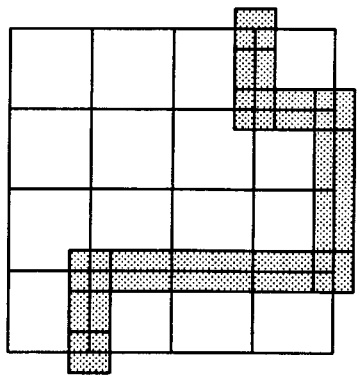
FIGS. 9A–9C illustrate the process of conventional grid based routing.
Figure 9B:
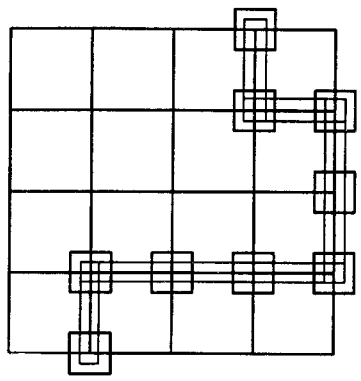
Figure 9A:
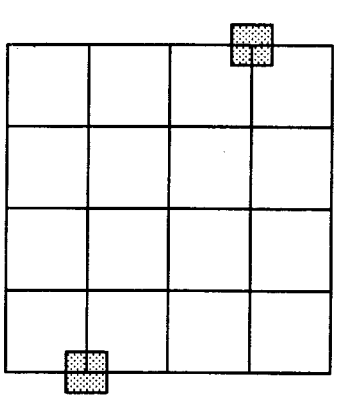

FIG. 9A illustrates a conventional routing grid and two pins that need to be connected. FIG. 10A illustrates the subgrid detailed router according to the present invention. It is noted that the resolution of the subgrids is 16X greater according to the present invention than the resolution of the conventional grids. This increased resolution, as will be described in further detail hereinafter, is useful for improving routing density with variable width and variable spacing designs.

FIG. 9B illustrates routing a net at the coarse level along the grid using a conventional router. FIG. 10B illustrates routing a net at the coarse level along the grid using the subgrid-detailed router of according to the present invention. Notably, both routers route at the same grid level. The primary difference is that whereas the conventional router searches based upon a single binary representation associated with each grid location, that the present invention searches using the code associated with each grid, as mentioned above. The use of searching using this code, rather than using the single binary representation, has extremely minimal impact on the overall runtime of the search. Thus, as will be described in further detail hereinafter, the present invention is as efficient as conventional grid based routers in finding an appropriate path.

Figure 10C:
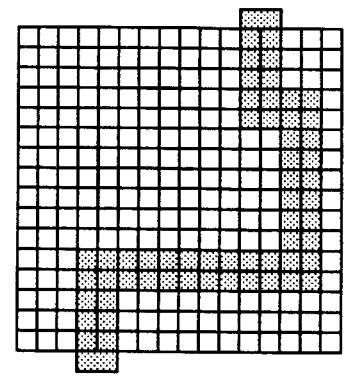
FIGS. 10A–10C illustrate the process of subgrid detailed routing according to the present invention.
Figure 10B:
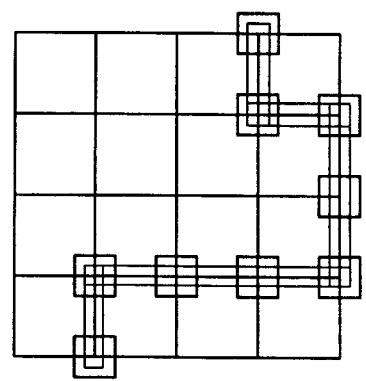
Figure 10A:
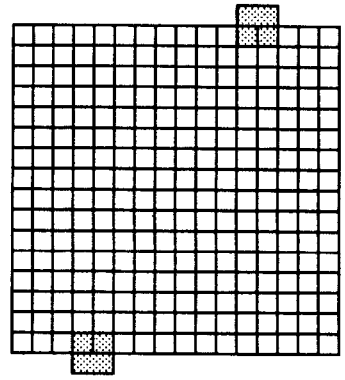

FIG. 9C illustrates the result of the conventionally routed wire, whereas FIG. 10C illustrates the result of the wire routed using the subgrid-detailed router according to the present invention. It will be noted that the wire formed using the subgrid-detailed router has boundaries determined by the resolution of the subgrids, whereas the wire formed conventionally has boundaries determined by the resolution of the grid. The resultant wire spacing that can be accommodated according to the present invention, therefore, is more precise. It is this precision that allows the present invention to accommodate variable width and variable spacing designs.

In the overview provided above and as shown in FIG. 8, the preferred resolution of the subgrids 22 is 16 times that of the grid, in a 4×4 array within the subgrid. While lesser or greater resolutions, such as a 2×2, 3×3, 4×6, 5×5, 2×8, 8×8 or other arrays for the subgrid 22 are within the intended scope of the present invention, it has been determined that a 4×4 array subgrid 22 provides sufficiently fine resolution to implement circuit designs have advanced design requirements such as variable width and spacing, without overly increasing the complexity of the design, as well as the time that the implemented design takes to operate when being used.

It should be noted that each subgrid forms part of a row or column of subgrids. While each row or column does not need to be the same size, each of the subgrids within each row or column must have dimensions that conform to the dimensions of the row or column.

Details of the subgrid router according to the present invention will now be described. Before this description, however, a few more concepts will be introduced, which will facilitate in the overall understanding of the present invention.

One concept that will be further commented upon is that of reference point routing. As mentioned in the background section, in the centerline convention, the grid describes the acceptable location for the centerline of paths. Reference point routing, such as reference point routing using the centerline convention, is used so that the routing problem can be abstracted to a graph-theoretical problem of finding a least-cost path in a routing graph. This graph can be represented explicitly as a general graph, or implicitly as a 3D array of grid points with certain connectivity information between adjacent grid points. In either case, this abstraction transforms the problem of routing wires with nonzero width and nonzero spacing, into a point-to-point connection problem abstracting away the concept of width and spacing. This will be appreciated from the specific illustration provided below with respect to FIGS. 11A–B, 12A–B and 13A–B.

Consider a simplified planar routing problem with only a single width W and a single spacing S. The idea is that routing a wire with width W and spacing S is equivalent to routing a wire with zero width and spacing W/2+S. In other words, a routing path is represented by a sequence of "moves" of the reference point between adjacent grids. Each point in the path defines a square of width W with a certain offset with respect to the point.

Figure 11B:
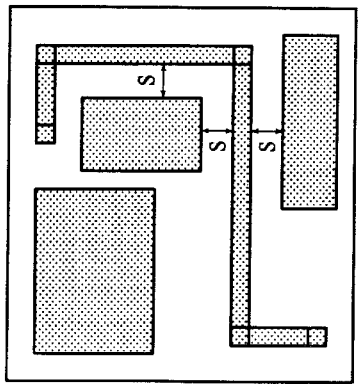
FIGS. 11A–11B and 12A–12B illustrate different manners of abstracting wire widths and spacing in a grid based routing system
Figure 12B:
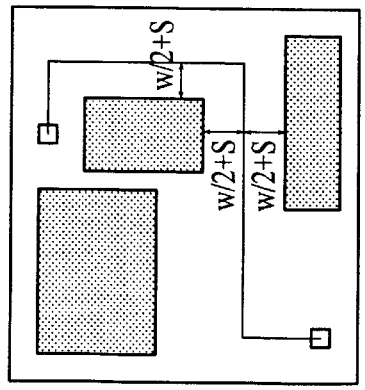
Figure 11A:
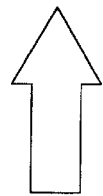
Figure 11A:
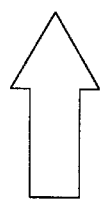
Figure 11A:
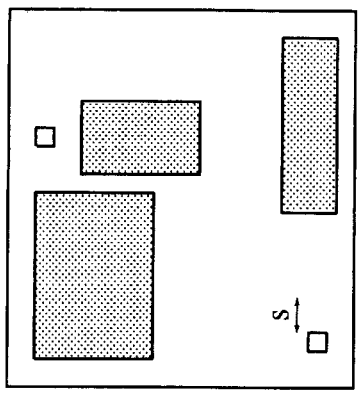
Figure 12A:
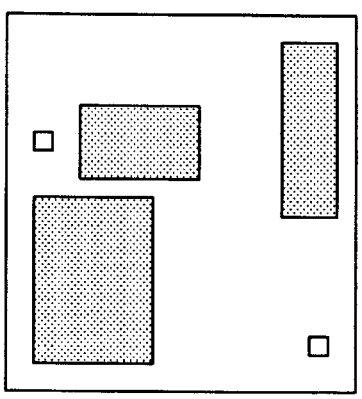

For example, FIGS 11A and 11B illustrates routing a net with width W and spacing S Such a representation can, as noted above, be translated to routing a net with width 0 and spacing W/2+S, as illustrated in FIGS. 12A and 12B. The path found using the latter approach of FIGS. 12A–12B is equivalent to the centerline of the path found using the first approach of FIGS. 11A–11B.

Figure 13B:
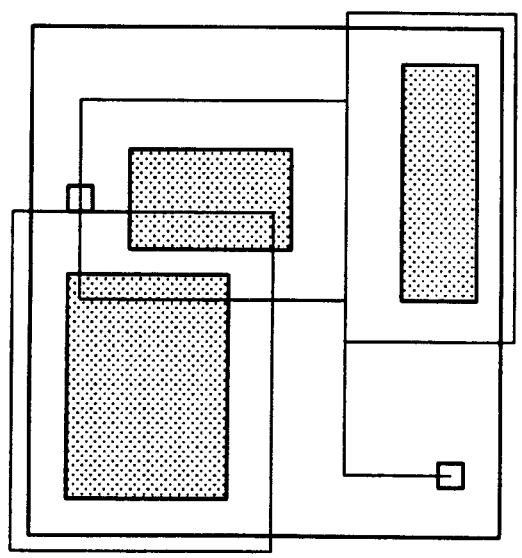
FIGS. 13A–13B illustrate a manner of abstracting wire widths and spacing in the subgrid detailed router according to the present invention.
Figure 13A:
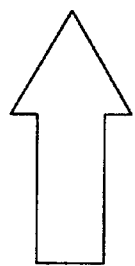
Figure 13A:
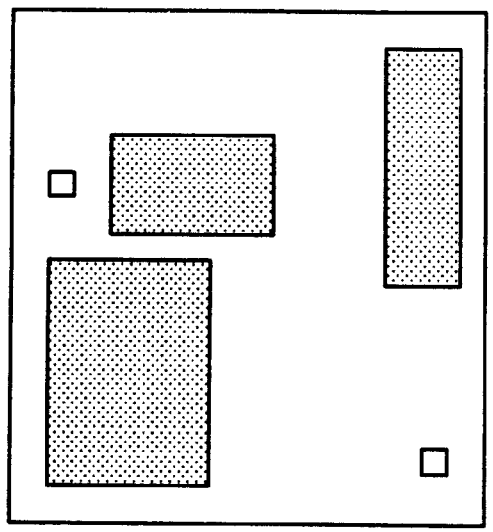

The second approach of FIGS. 12A–12B can be transformed to a third approach, illustrated in FIGS. 13A and 13B. Suppose each obstacle R is bloated by W/2+S, and xl, xr, yb, yt are set as the coordinates of R. The bloating of R by B (a positive value) is defined to be the rectangle with coordinates xl−B, xr+B, yb−B, yt+B. Using this translation, the routing problem is simplified to finding a path of zero width and zero spacing, as shown by FIGS. 13A and 13B.

Each of the approaches described above with reference to FIGS. 11A–B, 12A–B and 13A–B are equivalent. The third approach of FIGS. 13A–B, also referred to hereinafter as reference point routing, allows the translation of a general variable-width variable-spacing routing problem into a simple problem of routing a reference point of zero width and zero spacing, with the appropriate among of bloating for each component (also referred to as obstacle). In particular, each obstacle will be bloated by W/2+S, where W is the width of the wire currently being routed, and S is the desired spacing between the wire currently being routed and the obstacle (the spacing can be obstacle-dependent). It should also be noted that in the preferred embodiment, the assumption is made that via bloating is at least as much as wire bloating. The implication is that the VMAP for vias always subsumes the WMAP for wires, as will become apparent from further descriptions of WMAP and VMAP hereinafter.

Another concept that will be further introduced is that of map building. As indicated previously, the present invention uses availability indicia to represent whether it is legal to place a wire at any given subgrid. Accordingly, a 3D map is made that represents whether each subgrid is available. In this regard, it should be noted that two different 3D maps are preferably made: one map that is used to track the locations of the subgrids where a wire of a square size of the given width can be legally placed there without causing design-rule violation with existing obstacles (called WMAP), and another map that is used to track the locations of the subgrids where a via of the given size can be legally placed there without causing design-rule violation with existing obstacles (called VMAP).

In addition to how the representation is made with respect to WMAP, also important is the determination that is used to obtain the representation, which is: A subgrid point at location (x, y, z) is wire-legal if and only if: A square wire of width W centered at (x, y, z) is design-rule-correct with respect to the existing obstacles.

By design rule correct is meant that this square has a distance of at least S from any obstacle. Whether a subgrid point is wire-legal or not is static information that is determined before routing the net, using, in the preferred embodiment of the invention, the following pseudocode:

for each subgrid point f do
    mark f as LEGAL;
end for
for each obstacle R do
    R=R bloated by W/2+S;
    for each subgrid point f covered by R do
        mark f as ILLEGAL;
    end for
end for With respect to whether a subgrid point is design rule correct, in the preferred embodiment, if there are two rectangles that are touching (but not overlapping), any subgrid points on the common line will be marked as LEGAL. This can be expresses mathematically as: a point (x, y, z) is covered by a given rectangle R with coordinates xl, xr, yb, yt if and only if: xl<x<xr, and yb<y<yt, and R is on the layer z; where, x, y, and z are three dimensional coordinates and l, r, b, and t stand for left, right, bottom and top, respectively.

Using a similar representation, VMAP representations can be determined using the following: a given location(x, y, z) is via-legal if and only if: A via centered at (x, y) connecting layer z and layer z+1 is design-rule-correct with respect to the existing layout geometries.

The final concepts that will be further elaborated upon before describing the overall process of the router according to the present invention are those of subgrid representation, wave expansion, and the single component assumption.

With respect to the grid representation, FIG. 7, previously described, illustrates the 16 different subgrids in a grid. The contents of locations 0, 1, 2, 3, 4, 5, 6, 7, 8, 9, A, B, C, D, E, and F can be represented in a variety of ways. In the preferred embodiment, by convention, a row major scheme is used, with the lower-left (upper-right) corner of the grid represented by the least (most) significant bit. This allows the contents of the subgrids for each grid to be represented as four base-sixteen numbers, such that the number "F332" corresponds to the binary bit pattern 1111001100110010 and the subgrid pattern:

1111
0011
0011
0010

As mentioned previously, initially, all subgrid points are set to ones (LEGAL) on both the WMAP and the VMAP. As obstacles including wires are added and wires are added, rectangles representing these obstacles will be generated, as described hereinafter, and, subsequently, some of the ones will be set to zero (ILLEGAL) based on the algorithm as described above. FIGS. 14A–14C illustrate the representation of obstacles 14I, 14J and 14K being added, respectively, to an area that is covered by six grids. In each of FIGS. 14A–14C, an additional obstacles representation is added, which will ultimately cause additional subgrid indicia to be changed from a "1" to a "0". When the subgrid indicia is changed, so also does the code that represents the subgrid.

Another concept is the concept called the single component assumption (SCA). The significance of the single component assumption will become apparent in the following description. A grid will satisfy the single component assumption if the pattern of ones and zeros in the grid is such that every "one" in the pattern is reachable from any other "one" in the pattern. By reachable we mean there exists a consequence sequence of adjacent "ones" from the first one to the last one. FIGS. 15A–F illustrate grid patterns that satisfy the SCA and FIGS. 16A–F illustrate patterns that do not satisfy the SCA.

With SCA, all legal subgrids in a grid truly form a group, because they are reachable from each other. Once a particular subgrid is known as being reachable, it is therefore known that all legal subgrids in the same grid are reachable.

Figure 17:
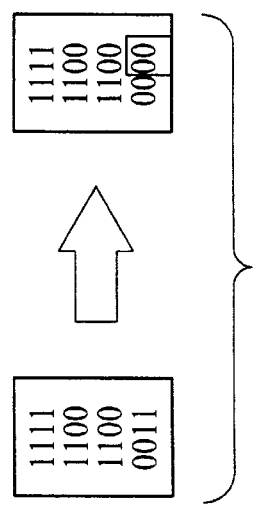
FIG. 17 illustrates the process of altering a grid that does not satisfy the single component assumption into a grid that satisfies the single component assumption according to the present invention.

In practice, most patterns that appear after map building satisfy the SCA. Patterns that do not satisfy SCA, however, can be converted to patterns that satisfy SCA. The process—called SCA-ification—works by turning some one's into zeros until the pattern satisfies the SCA. This process can be performed in constant time by table-lookup. An example of SCA-ification is illustrated in FIG. 17. SCA-ification can be easily implemented using a lookup table that maps each possible configuration ($2^{16}$) to a single component subset. This can first be done for the WMAP, while tracking all the grid points with such problem by saving their old bitmasks. Then, the VMAP is updated together with the WMAP, since at the end there is the need to ensure that (1) each subgrid in the VMAP is subsumed by the corresponding subgrid in the WMAP, and (2) each grid in the WMAP/VMAP satisfies SCA. It is noted that since it is assumed that the number of SCA-violated grids is very small, keeping track of them is not very expensive. Once routing is complete, the SCA fixes are undone so that WMAP and VMAP are restored to their previous state. This is important if it is desired to reuse WMAP and VMAP or to perform incremental updates.

Now that the above concepts have been introduced, the detailed subgrid routing process according to the present invention can now be succinctly stated. In particular, once WMAP and VMAP have been computed, all legal path locations can be determined by the maze router. Thus, the maze router can perform a maze expansion to find the connection between the terminals of the nets.

Typically, the goal of the maze expansion is to find a design-rule-correct path that runs from a source to a destination. Since the WMAP and VMAP capture the design-rule correctness of putting wires or vias at every single subgrid locations, if there exists a sequence of adjacent subgrid points that are wire-legal and via-legal, then such sequence describes a design-rule correct centerline path from the source to the destination.

In other words, in the subgrid detailed router, the goal is to find a path (a sequence of subgrid location) such that:

1. For every subgrid location (x, y, z) in the path, WMAP(x, y, z) is one (=LEGAL); and
2. For every pair of adjacent subgrid locations (x, y, z) and (x, y, z+1) which represents a via connection, VMAP(x, y, z) is one (=LEGAL).

Figure 14E:
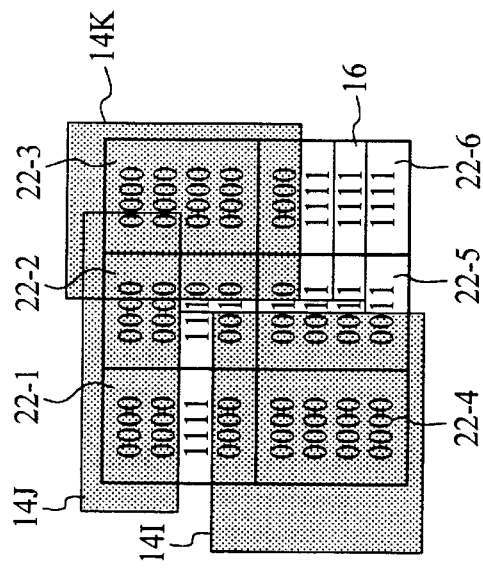
Figure 14E:
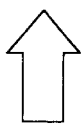
Figure 14F:
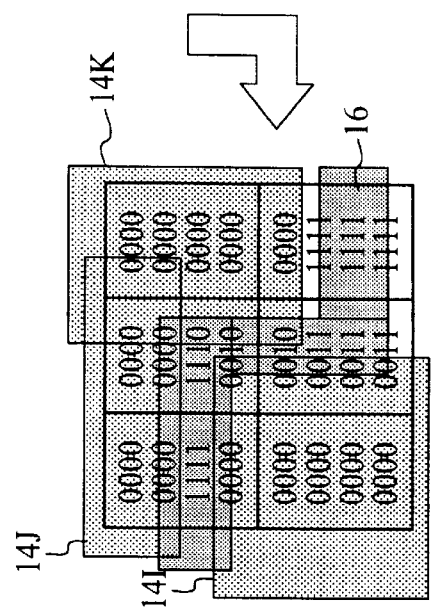
Figure 15:
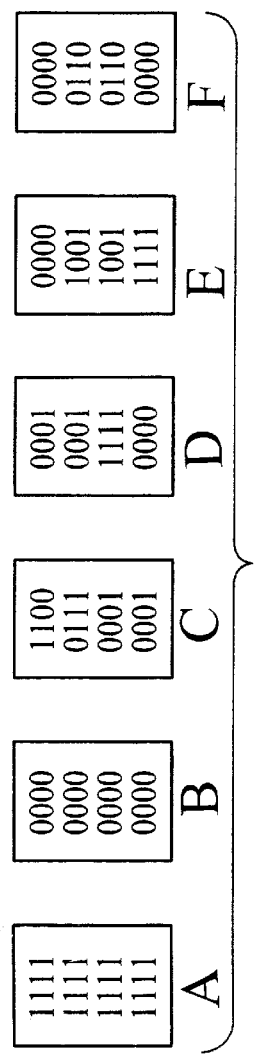
FIGS. 15A–15F illustrate examples of grids that satisfy the single component assumption according to the present invention.
Figure 16:
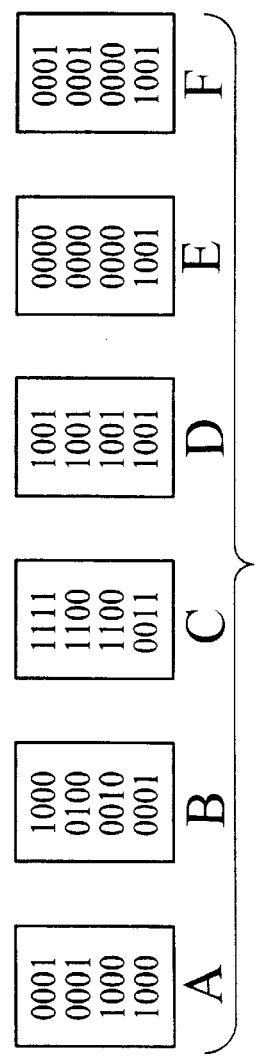
FIGS. 16A–16F illustrate examples of grids that do not satisfy the single component assumption according to the present invention.

FIGS. 14E and 14F illustrate that there exists adjacent "1 s" in the subgrid such that a valid path exists through the grids.

Formalistically, maze expansion can be described as follows: if there exists a legal path from a source such as a pin to the current subgrid location (x, y, z), the expansion operation must determine whether moving from the current subgrid point to its neighbors are legal—with the neighbors being the subgrid points with coordinates (x+1, y, z), (x−1, y, z), (x, y+1, z), (x, y−1, z), (x, y, z+1), (x, y, z−1). Put another way, suppose that there exists a sequence of ones from the source to the current subgrid point (x, y, z). Consider its east neighbor (x+1, y, z). If WMAP(x+1, y, z) is one (LEGAL), then there exists a path from the source to (x+1, y, z) through (x, y, z). Consider its UP neighbor (x, y, z+1). If VMAP(x, y, z) is one (LEGAL), then there exists a path from the source to (x, y, z+1) through (x, y, z). This simple process of determining local reachability from one subgrid point to its neighbor using the WMAP and VMAP information is the basis for the process of wave expansion.

This process for wave expansion, however, if implemented using a conventional router would be extremely slow, as has been mentioned previously. In order to speed the process up, as has been mentioned previously, rather than routing from each subgrid to subgrid, the present invention instead operates using the code for an entire grid and comparing that code with the code for adjacent grids during the expansion process. Thus, a group of subgrids are expanded to another group of subgrids. In order for this comparison, and thus the expansion to be valid, however, the single component assumption must be true. If true, therefore, a simple comparison of adjacent grid edges will determine whether the expansion to the nearest neighbor can take place. Accordingly, if a particular grid does not satisfy the SCA, it will be made to satisfy the SCA. While this results in some otherwise legal subgrids being forced to an illegal status (by turning from one to zero), extensive experimental results show that in practice, over 99.9% of all grids satisfy the SCA, and therefore this does not become an issue.

Thus, using the grids 22-1 to 22-6 illustrated in FIG. 14E, it can be seen that at the subgrid level there is a path of "1 s" that allow a source that has reached the west side of grid 22-1 to reach the east side of grid 22-6. Using the expansion from grids 22-1 to 22-2 as an example, given that these two grids are adjacent grids on the same layer, grid 22-2 is reachable from grid 22-1 if and only if there exists two legal subgrids, one in grid 22-1 and one in grid 22-2 that are adjacent to each other. And it can be seen that there are. The east edge of grid 22-1 and the west edge of grid 22-2 have the following adjacent bit patterns:

00
11
00

Since there are two adjacent "1 s", a path can be extended from grid 22-1 to grid 22-2. If, however, grid 22-2 were desired to reach grid 22-3, this would not be allowed, since the east edge of grid 22-2 and the west edge of grid 22-3 have the following adjacent bit patterns:

00
00
00
00

Grid 22-2, however, can be extended to grid 22-5, since the south edge of grid 22-2 and the north edge of grid 22-5 have the following adjacent bit pattern:

00
00
11
00

Since, however, the indicia in each subgrid are represented by the grid code, as described previously, the reachability of one grid to an adjacent grid can be computed in constant time using a bitwise operation on the code in WMAP corresponding to the two adjacent grids.

A few final examples of three different pairs of adjacent subgrid indicia that are not reachable from one grid to the next are as follows:

| 01  | 00  | 10  |
|-----|-----|-----|
| 10  | 10  | 10  |
| 01  | 01  | 01  |
| 10  | 00  | 01  |
| (1) | (2) | (3) |

Similarly, reachability can be computed in real time using VMAP for vias. Thus, with respect to the example illustrated in FIGS. 14A–14F, the wire 16 illustrated in FIG. 14F can be located using the expansion at the grid level with the maze router performing bitwise compare operations on the 16 bit code associated with adjacent grids.

Figure 18A:
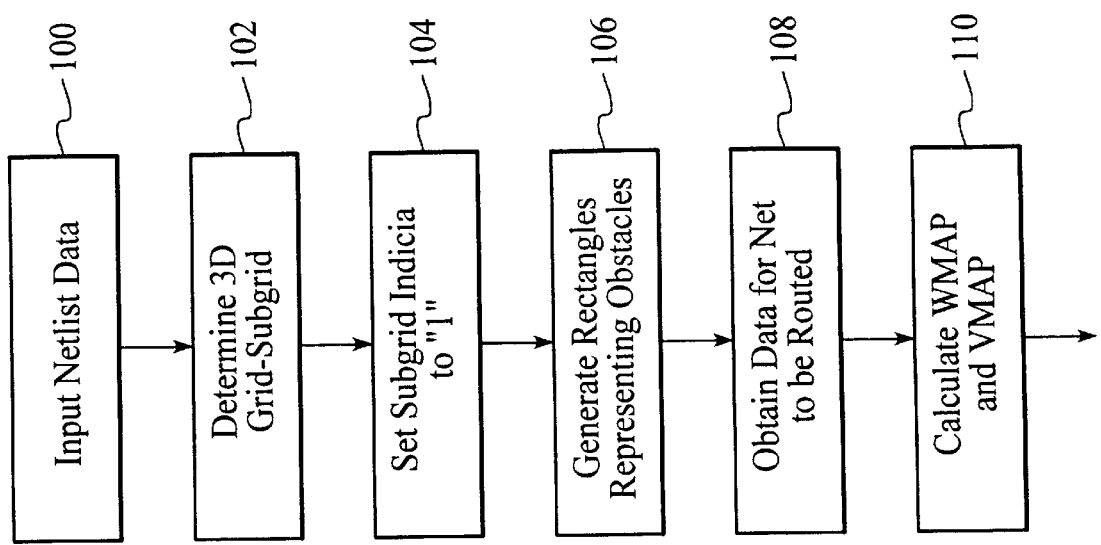
FIGS. 18A–B illustrates a flowchart of the process of the subgrid-detailed router according to a preferred embodiment of the present invention.
Figure 18B:
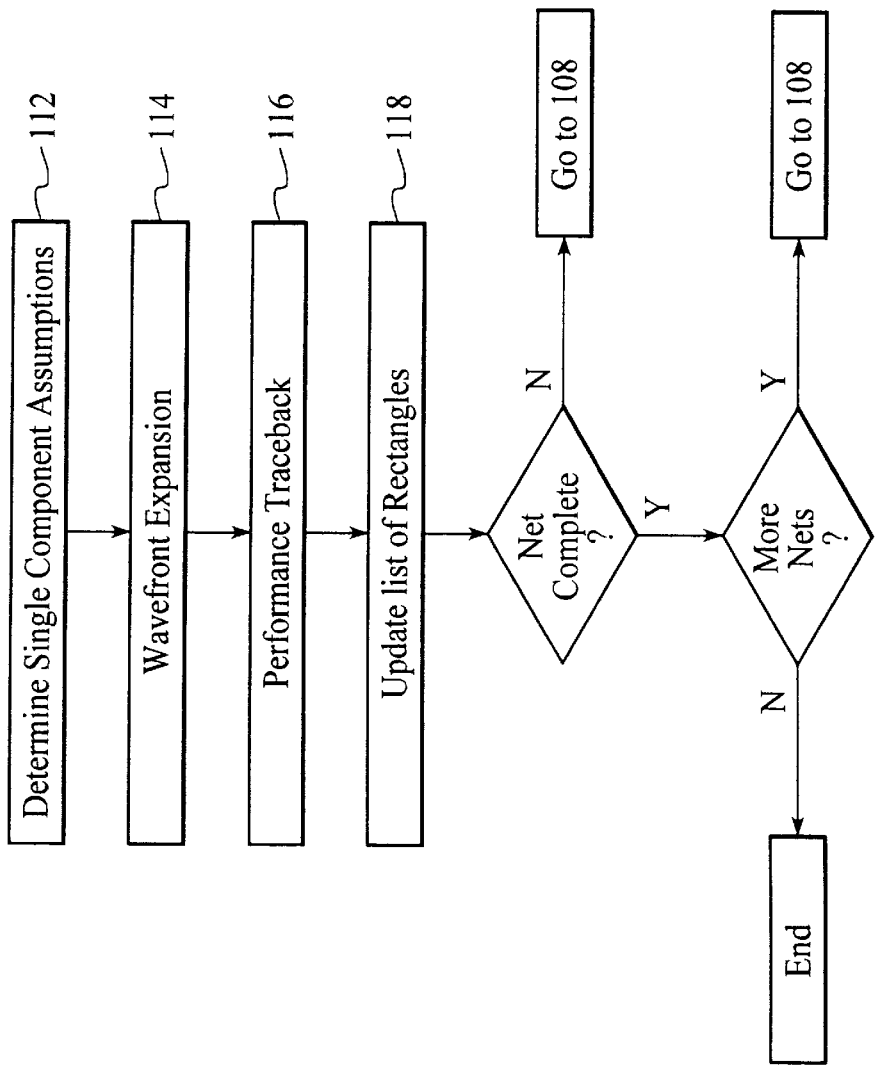

In view of the previous descriptions, the operation of the subgrid-detailed router according to the present invention should be understood. To ensure, however, that the overall operation is understood, the overall operation of the subgrid-detailed router according to the present invention will now be described with reference to the flowchart of FIGS. 18A and B. Initially in step 100, netlist data from the global routing step input, which will provide information on, for example, the integrated circuit modules, placement and global routing information. Thereafter, in a step 102, the router 20 determines the desired 3D grid/subgrid characteristics using the information obtained from step 100. It should be noted that the present invention can also be implemented such that the user is restricted to developing integrated circuit chips having specific grid/subgrid characteristics, thereby resulting in the feature of step 102 not being alterable by the user. Thereafter, in step 104 the subgrids that have been established (i.e. the indicia in WMAP and VMAP) are all set to "1." Step 106 follows and there is generated and stored a list of rectangles from the netlist information on the router computer, which rectangles will subsequently be used to determine nonavailability indicia on the 3D routing grid.

Upon completion of step 106, initial set-up of the subgrid-detailed router according to the present invention is finished and the router then begins to route the first net. In step 108, router 20 takes the data associated with the first connection of two pins within the first net, the router thus knows the beginning point, the end-point, and characteristics of the net, such as desired width and spacing. Using these characteristics, step 110 follows, and the availability and nonavailability indicia of WMAP and VMAP are calculated for that particular net. It should be noted that this calculation includes the bloating of the rectangles that have been generated in step 106 in order to determine WMAP and VMAP. From this indicia, the grid codes are established as well.

Figure 19:
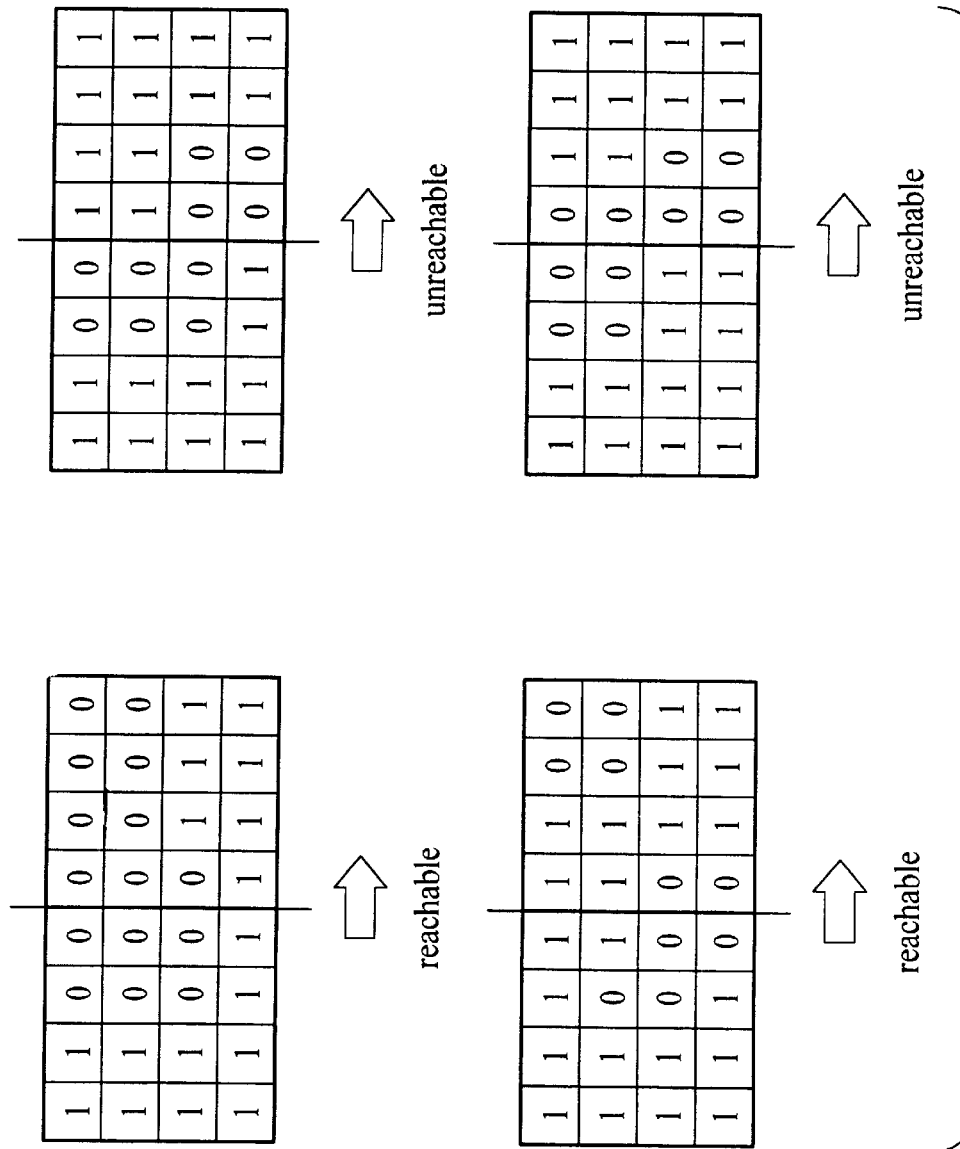
FIG. 19 illustrates the process of determining whether a path can be extended from one grid to an adjacent second grid by performing a bitwise AND operation between adjacent subgrids of the two said grids.

Step 112 follows, and, using the calculated grid codes, the router determines whether the single component assumption is valid for each of the grids. If it is not, then those grids for which the SCA is not valid are made valid, as describe previously. Thereafter, step 114 follows, and the subgrid-detailed router performs wavefront expansion, using maze router algorithms operating upon the grid codes. Essentially, however, an AND operation is performed on adjacent subgrid pairs for adjacent grids to determine if there exists a path, i.e. a "11" combination of one of the four subgrids, between one grid and another grid, as illustrated in FIG. 19. In this regard, it is apparent that contiguous (and adjacent) subgrids that are immediately next to each other in the horizontal and vertical direction only (and same coordinates but adjacent layers). Subgrids that are next to each other diagonally are not considered adjacent.

As a result of step 114, a coarse representation of the path of the first net is obtained. Subsequently, in step 116, a subgrid traceback is performed at the subgrid level to determine the actual connection in the subgrid resolution. It is noted that there is guaranteed an actual connection path at the subgrid level, within the path on the grid level that was found using the grid-level wavefront expansion, and this is found by searching for a sequences of adjacent "1 s" from the endpoint back to the beginning point within the path on grid level that was found using the grid-level wavefront expansion. Of course, this search could also take place from the beginning point to the endpoint.

Step 118 follows in which the actual connection path found in step 116 is added to the list of rectangles of the router computer, so that during the next search, the newly added connection can be considered. If the newly added connection is part of an incomplete net, then the newly added connection will be considered the entire pin for the next connection to the next portion of the net, until that net is completed. If the newly added connection is a complete net, then it will be considered an obstacle for all subsequent nets that are routed.

Step 120 follows thereafter, in which the router 20 determines if that net is complete. If not, then steps 108 and forward are repeated for each remaining portion of the net.

If the net is complete, then step 122 follows thereafter, with the router deciding if additional nets exist. If so then step 108 and forward are repeated for each remaining net, in a manner corresponding to that previously described. If no additional nets exist, then routing is complete and the process ends.

It should be noted that the above-described process can be implemented in software in many different manners. For example, steps of generating WMAP and VMAP are can be performed by an incremental update, rather than a recalculation. Accordingly, the above description of the process should be read as describing the features that the present invention implements, while the particular sequence of steps, and implementation of steps, will no doubt vary since they can be implemented in software in numerous different manners, as will be appreciated by one of ordinary skill in the art.

While the present invention has been described herein with reference to particular embodiments thereof, a latitude of modification, various changes and substitutions are intended in the foregoing disclosure, and it will be appreciated that in some instances some features of the invention will be employed without a corresponding use of other features without departing from the spirit and scope of the invention as set forth in the appended claims.

We claim:

1. A method of automatically extending a wire location representation from one grid to another grid comprising:
   comparing a first plurality of subgrid indicia associated with certain subgrids of the one grid with a second plurality of subgrid indicia associated with certain subgrids of the another grid to determine whether the wire representation can be extended from the one grid to the another grid, wherein each of the subgrid indicia indicates one of availability and nonavailability of a corresponding wire portion representation and the first plurality of subgrid indicia and the second plurality of subgrid indicia are adjacent to each other.

2. A method according to claim 1 wherein the indicia of availability and nonavailability are represented in binary form.

3. A method according to claim 2 wherein all of the subgrid indicia for each different grid are stored as a separate single code.

4. A method according to claim 3, wherein the subgrid associated with the one grid and the subgrid associated with the another grid are each formed in an array.

5. A method according to claim 4 wherein the size of the array of the one grid is the same as the size of the array of the second grid.

6. A method according to claim 5 wherein each grid contains from 4 to 64 subgrids, inclusive.

7. A method according to claim 5 wherein each grid contains sixteen subgrids.

8. A method according to claim 7 wherein the sixteen subgrids are disposed in a 4×4 array.

9. A method according to claim 8 wherein the first plurality of subgrid indicia is that indicia which is adjacent to the another grid and the second plurality of subgrid indicia is that indicia which is adjacent to the one grid.

10. A method according to claim 9, wherein the step of comparing performs an AND operation on each one of the first plurality of subgrid indicia with an adjacent one of the second plurality of subgrid indicia.

11. A method according to claim 3 wherein the first plurality of subgrid indicia is that indicia which is adjacent to another grid and the second plurality of subgrid indicia is that indicia which is adjacent to the one grid.

12. A method according to claim 11, wherein the step of comparing performs an AND operation on each one of the first plurality of subgrid indicia with an adjacent one of the second plurality of subgrid indicia.

13. A method according to claim 1 wherein the subgrids of the one grid and the subgrids of the another grid are established prior to the step of comparing, and the first plurality of subgrid initia and second plurality of subgrid initia are initially set to indicate availability, and further comprising, prior to the step of comparing, the step of changing certain ones of said first plurality of subgrid indicia and certain ones of said second plurality of subgrid indicia to indicate nonavailability corresponding to the presence of an obstacle and a bloating of the obstacle.

14. A method according to claim 13 wherein the bloating of the obstacle is determined in part using the width and spacing needed for the wire being represented.

15. A method according to claim 14 further comprising, prior to the step of comparing, the steps of:
   determining those plurality of grid representations that do not permit the plurality of indicia associated therewith to be represented as a single component of contiguous locations; and
   altering certain of the indicia associated with those plurality of grid representations for which the plurality of indicia associated cannot be represented as the single component of contiguous locations so that those plurality of grid representations contain an updated plurality of indicia that can be represented as the single component of contiguous locations, wherein the step of altering changes said certain indicia from indicating availability to indicating nonavailability.

16. A method according to claim 1 wherein said step of comparing is a detailed routing step and further including a global routing step that precedes the detailed routing step.

17. A method of determining whether a wire representation can be routed from a first grid to an adjacent second grid, each of said first and adjacent second grids including at least four subgrids, said subgrids of said first grid being aligned with said subgrids of said second grid, and each of said subgrids having associated therewith an indicia, in which an availability indicia indicates an area corresponding to that subgrid is available and a nonavailability indicia indicates the area corresponding to that subgrid is not available, the availability indicia and nonavailability indicia for each grid being represented as a digital representation, comprising the steps of:

operating on the first digital representation and the second digital representation to determine if there exists an availability indicia in one subgrid of the first grid that is aligned with an availability indicia in one subgrid of the second grid, such that
if it is determined that there exists an availability indicia of any one subgrid of the first grid adjacent to the second grid and an availability indicia of the one subgrid of the second grid adjacent to that subgrid of the first grid, then it is determined that the wire representation can be routed from the first grid to the second grid.

18. A method according to claim 17 wherein during the step of operating on the first digital representation,
if it is determined that there exists a nonavailability indicia of any one subgrid of the first grid adjacent to the second grid and an availability indicia of the one subgrid of the second grid adjacent to that subgrid of the first grid, then it is determined that the wire representation cannot be routed from the first grid to the second grid using those adjacent subgrids;
if it is determined that there exists an availability indicia of any one subgrid of the first grid adjacent to the second grid and a nonavailability indicia of the one subgrid of the second grid adjacent to that subgrid of the first grid, then it is determined that the wire representation cannot be routed from the first grid to the second grid using those adjacent subgrids; and
if it is determined that there exists a nonavailability indicia of any one subgrid of the first grid adjacent to the second grid and a nonavailability indicia of the one subgrid of the second grid adjacent to that subgrid of the first grid, then it is determined that the wire representation cannot be routed from the first grid to the second grid using those adjacent subgrids.

19. A method according to claim 17 further comprising the step of changing the availability indicia for the one subgrid of the first grid and the availability indicia of the one subgrid of the second grid to the nonavailability indicia when it is determined that the availability indicia of the one subgrid of the first grid aligns with the availability indicia of the one subgrid of the second grid and that the wire representation will use the path including the first grid and the second grid.

20. A method according to claim 17 wherein said step of operating is a detailed routing step and further including a global routing step that precedes the detailed routing step.

21. A method of preparing a plurality of grid representations for routing a wire location representation, each of the plurality of grid representations including a plurality of subgrids each having an indicia associated therewith corresponding to a respective plurality of locations indicative of whether the location is available or nonavailable, comprising the steps of:

determining those plurality of grid representations that do not permit the plurality of indicia associated therewith to be represented as a single component of contiguous locations; and
altering certain of the indicia associated with those plurality of grid representations for which the plurality of indicia associated cannot be represented as the single component of contiguous locations so that those plurality of grid representations contain an updated plurality of indicia that can be represented as the single component of contiguous locations, wherein the step of altering changes said certain indicia from indicating availability to indicating nonavailability.

22. A method according to claim 21 wherein the grids and subgrids are disposed in an array.

23. A method according to claim 21 wherein each of the subgrids contains from 4 to 64 subgrids, inclusive.

24. A method according to claim 23 wherein each of the grids contains the same number of subgrids.

25. A method according to claim 24 wherein the number of subgrids in each grid is sixteen, and the sixteen subgrids are disposed in a 4×4 array.

26. A method of automatically making a subgrid wire location representation that spans a plurality of grids comprising:

comparing a first plurality of subgrid indicia associated with a subgrid of one grid with a second plurality of subgrid indicia associated with a subgrid of another grid to determine whether the wire representation can be extended from the one grid to the another grid, wherein each of the subgrid indicia indicates one of availability and nonavailability of a corresponding wire portion representation;
repeating the step of comparing until the wire representation spans from a beginning point until a desired endpoint;
determining the subgrid wire location representation within certain ones of the subgrids of grids included within the wire representation.

27. A method according to claim 26 further wherein the subgrid wire location representation is guaranteed to exist.

28. A method according to claim 27 further including the step of changing the availability indicia for those subgrids associated with the determined subgrid wire location representation to indicating nonavailability for subsequently generated wire representations.

29. A method according to claim 27 wherein the indicia of availability and nonavailability are represented in binary form.

30. A method according to claim 27, wherein the subgrid associated with the one grid and the subgrid associated with the another grid are each formed in an array.

31. A method according to claim 30 wherein the size of each array in each grid is the same.

32. A method according to claim 31 wherein each grid contains from 4 to 64 subgrids, inclusive.

33. A method according to claim 32 wherein each grid contains sixteen subgrids disposed in a 4×4 array.

34. A method according to claim 33, wherein the step of comparing performs an AND operation on each one of the first plurality of subgrid indicia with an adjacent one of the second plurality of subgrid indicia.

35. A method according to claim 27, wherein the step of comparing performs an AND operation on each one of the first plurality of subgrid indicia with an adjacent one of the second plurality of subgrid indicia.

36. A method according to claim 27 wherein the subgrids of the one grid and the subgrids of the another grid are established prior to the step of comparing, and the first plurality of subgrid initia and second plurality of subgrid initia are initially set to indicate availability, and further comprising, prior to the step of comparing, the step of changing certain ones of said first plurality of subgrid indicia and certain ones of said second plurality of subgrid indicia to indicate nonavailability corresponding to the presence of bloated obstacles.

37. A method according to claim 36 wherein the bloating of the obstacles is determnined in part using the width and spacing needed for the wire being represented.

38. A method according to claim 27 further comprising, prior to the step of determining, the steps of:
    determining those plurality of grid representations that do not permit the plurality of indicia associated therewith to be represented as a single component of contiguous locations; and
    altering certain of the indicia associated with those plurality of grid representations for which the plurality of indicia associated cannot be represented as the single component of contiguous locations so that those plurality of grid representations contain an updated plurality of indicia that can be represented as the single component of contiguous locations, wherein the step of altering changes said certain indicia from indicating availability to indicating nonavailability.

39. A method according to claim 26 wherein said steps of comparing, repeating and determining are included within a detailed routing step and further including a global routing step that precedes the detailed routing step.

40. A method of automatically extending a wire location representation from one region to an adjacent region of an integrated circuit chip representation comprising:
    determining that a wire representation can be extended from the one region to the adjacent region, the step of determining using:
        a first availability representation of a first edge of the one region that is adjacent to the adjacent region and which provides a finer level of detail than that provided for by a first global representation of the one region, and
        a second availability representation of a second edge of the another region that is adjacent to the one reaction and which provides another finer level of detail than that provided for by a second global representation of the adjacent region, and wherein
    the step of determining performs a logical operation that compares the first availability representation with the second availability representation to determine that the wire representation can be extended from the one region to the adjacent region.

41. A method according to claim 40 wherein the first availability representation includes information from subgrids of the first region and the second availability representation includes information from subgrids of the second region and the first and second global representations represent first and second grids, respectively.

42. A method according to claim 41 wherein the first availability representation and the second availability representation are represented in binary form as subgrid indicia.

43. A method according to claim 40 wherein the first availability representation and the second availability representation are represented in binary form.

44. A method according to claim 40 wherein said step of determining is a detailed routing step and further including a global routing step that precedes the detailed routing step.

45. A method according to claim 40 wherein the first region and the second region have a same size.

* * * * *